(12) United States Patent
Kim et al.

(10) Patent No.: US 12,469,796 B2
(45) Date of Patent: Nov. 11, 2025

(54) METHOD OF FORMING AN EMBEDDED MAGNETIC SHIELDING DEVICE

(71) Applicant: STATS ChipPAC Pte. Ltd., Singapore (SG)

(72) Inventors: ChangOh Kim, Incheon (KR); JinHee Jung, Incheon (KR); OMin Kwon, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 631 days.

(21) Appl. No.: 17/810,028

(22) Filed: Jun. 30, 2022

(65) Prior Publication Data

US 2024/0006335 A1  Jan. 4, 2024

(51) Int. Cl.
| | |
|---|---|
| *H01L 23/552* | (2006.01) |
| *H01L 21/48* | (2006.01) |
| *H01L 21/56* | (2006.01) |
| *H01L 23/31* | (2006.01) |
| *H01L 23/538* | (2006.01) |

(52) U.S. Cl.
CPC ........ *H01L 23/552* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01)

(58) Field of Classification Search
CPC .............. H01L 23/552; H01L 23/5383; H01L 23/5386; H01L 23/49822; H01L 23/50; H01L 23/293; H01L 23/3135; H01L 23/60; H01L 23/3128; H01L 23/3121; H01L 21/4853; H01L 21/4857; H01L 21/565; H01L 21/56; H01L 21/78
See application file for complete search history.

(56) References Cited

U.S. PATENT DOCUMENTS

| | | | |
|---|---|---|---|
| 10,388,611 | B2 | 8/2019 | Cho et al. |
| 10,593,629 | B2 | 3/2020 | Chiang et al. |
| 2018/0261550 | A1* | 9/2018 | Cho ........................ H01L 23/552 |
| 2020/0013721 | A1* | 1/2020 | Chiang ............... H01L 21/6835 |
| 2021/0407927 | A1 | 12/2021 | Salmon et al. |
| 2022/0095496 | A1* | 3/2022 | Nomura .................. H01L 25/18 |
| 2023/0420382 | A1* | 12/2023 | Kim ....................... H01L 25/165 |

* cited by examiner

*Primary Examiner* — Marlon T Fletcher
*Assistant Examiner* — Christina A Sylvia
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. A semiconductor die is disposed over the substrate. A first encapsulant is deposited over the semiconductor die. A ferromagnetic film is disposed over the first encapsulant. A second encapsulant is deposited over the ferromagnetic film. A shielding layer is optionally formed over the substrate, first encapsulant, and second encapsulant.

23 Claims, 11 Drawing Sheets

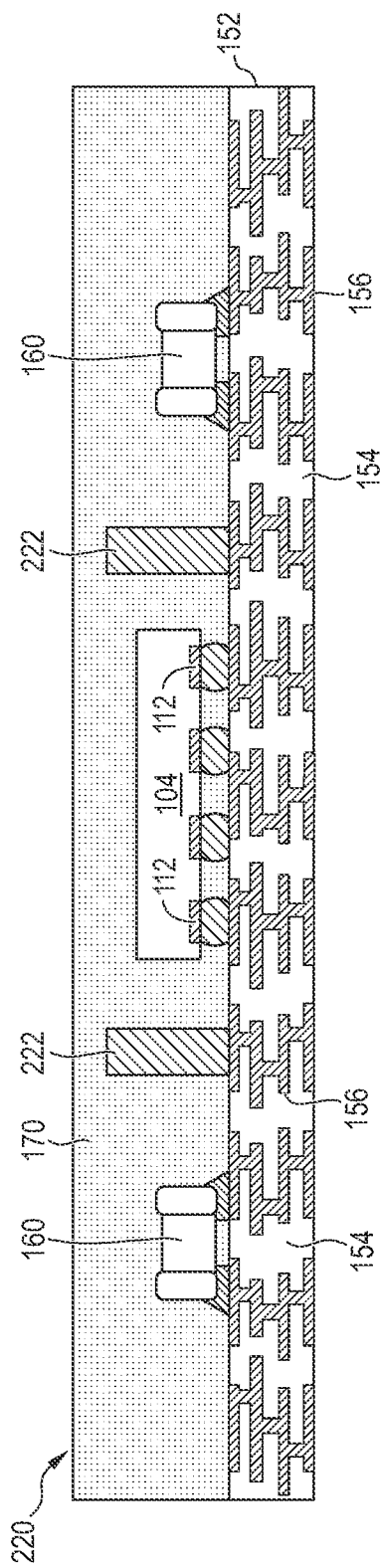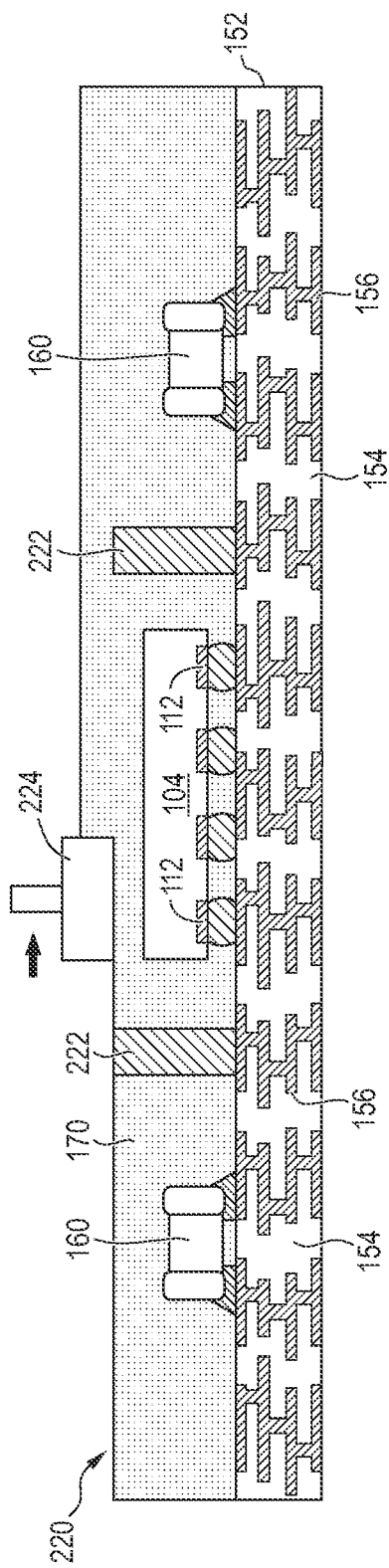

METHOD OF FORMING AN EMBEDDED MAGNETIC SHIELDING DEVICE

FIELD OF THE INVENTION

The present invention relates in general to semiconductor devices and, more particularly, to a semiconductor device and method of forming embedded magnetic shielding.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive shielding layers can be formed over semiconductor packages to reduce some interference. However, typical shielding layers only reduce higher frequency interference while being transparent to low frequency magnetic fields. To reduce low frequency magnetic interference, materials with a high magnetic permeability or ferrites are used to protect sensitive components.

Many problems exist with the use of ferromagnetic shielding. Magnetic film with high permeability is difficult to achieve using common deposition methods, such as physical vapor deposition, due to a high occurrence of crystalline defects. Applying magnetic film using a lamination process is also difficult due to delamination at the interface between the magnetic film and either the adjacent epoxy molding compound or metal shielding layer. Therefore, a need exists for improvements in ferromagnetic shielding for semiconductor packages.

BRIEF DESCRIPTION OF THE DRAWINGS

FIGS. 4a-4d illustrate conductive pillars disposed around a semiconductor die of the semiconductor package;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, wirebonds, or other suitable interconnect structures. An encapsulant or other molding compound is deposited over the package to provide physical support and electrical isolation. The finished package is then inserted into an electrical system and the functionality of the semiconductor device is made available to the other system components.

Figure 1A:
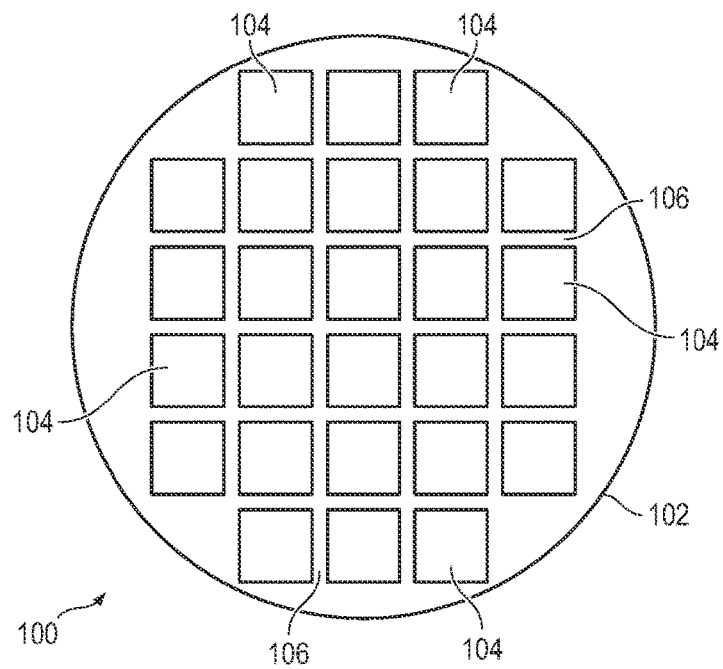
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
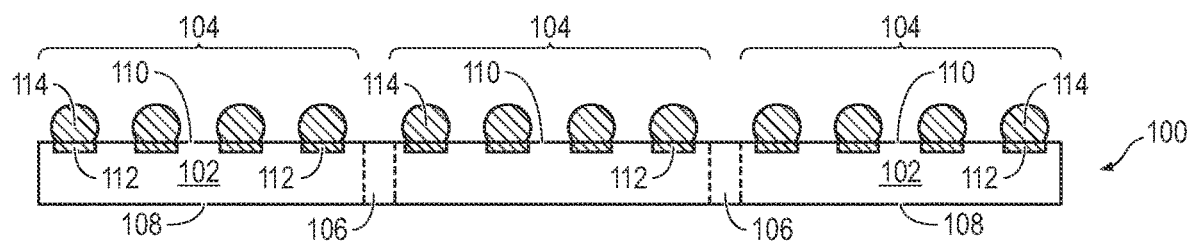

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. Conductive bumps 114 are optionally formed over an under-bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bumps, micro bumps, or other electrical interconnects.

Figure 1C:
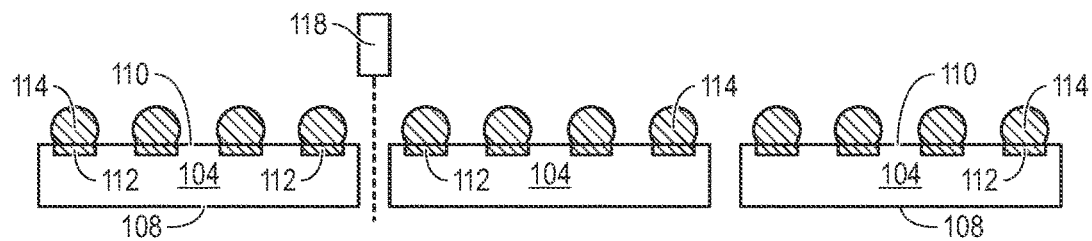

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post-singulation.

Figure 2A:
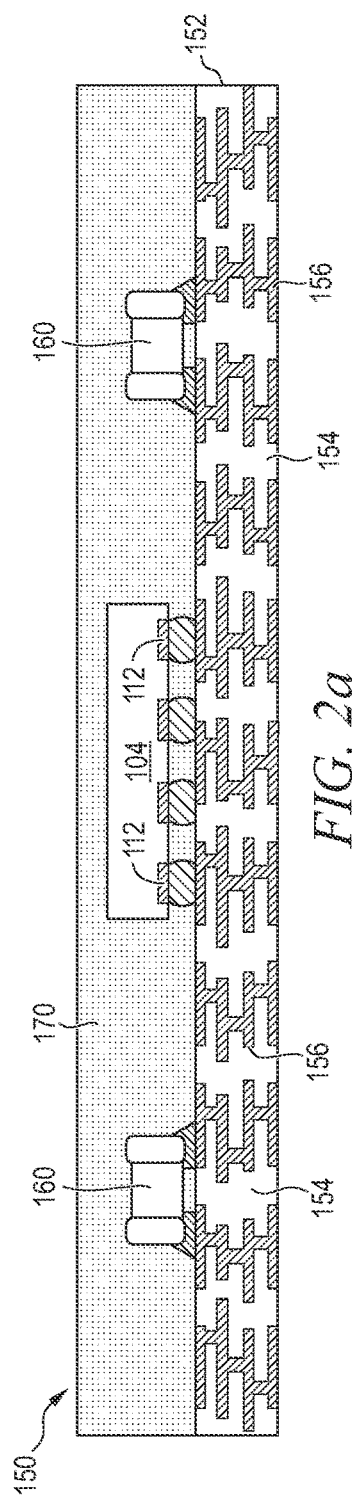
FIGS. 2a-2f illustrate forming a semiconductor package with embedded ferromagnetic shielding.

FIGS. 2a-2f illustrate forming a semiconductor package 150 with semiconductor die 104. In some embodiments, semiconductor package 150 is a system-in-package (SiP) module. FIG. 2a shows a partial cross-sectional view of a substrate 152. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Semiconductor package 150 in FIG. 2a has had semiconductor die 104 and discrete components 160 mounted thereon, as well as any other discrete active or passive components, semiconductor die, or other components desired for the intended functionality of the semiconductor package. Solder bumps 114 are reflowed between conductive layers 156 and semiconductor die 104 to mechanically and electrically connect the die to substrate 152. Any type and number of components can be mounted onto either the top surface of substrate 152 as illustrated in FIG. 2a, the bottom surface, or both, and also embedded within the substrate in any suitable order and configuration. Discrete components 160 as illustrated are merely representative. Any type and number of components can be used for any purpose.

After mounting of semiconductor die 104, discrete components 160, and any other desired electrical components onto substrate 152, the components are encapsulated by encapsulant or molding compound 170. Encapsulant 170 is deposited over substrate 152, semiconductor die 104, and discrete components 160 using paste printing, compressive molding, transfer molding, liquid encapsulant molding, vacuum lamination, spin coating, or another suitable applicator. Encapsulant 170 can be polymer composite material, such as epoxy resin, epoxy acrylate, or polymer with or without a filler. Encapsulant 170 is non-conductive, provides structural support, and environmentally protects the semiconductor device from external elements and contaminants. Encapsulant 170 completely covers top and side surfaces of semiconductor die 104 and discrete components 160. Encapsulant 170 fills any gaps between substrate 152 and semiconductor die 104 or discrete components 160 unless a separate underfill is used. Encapsulant 170 can be backgrinded to reduce a thickness of the encapsulant over semiconductor die 104.

Figure 2B:
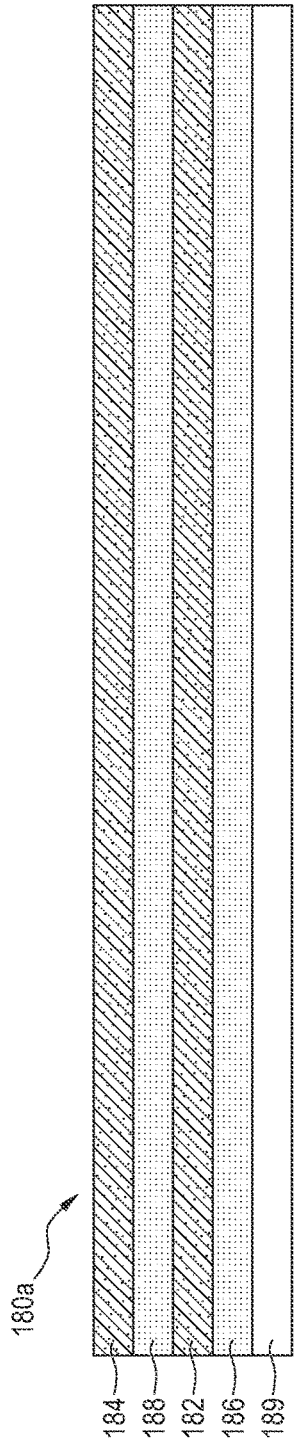
Figure 2C:
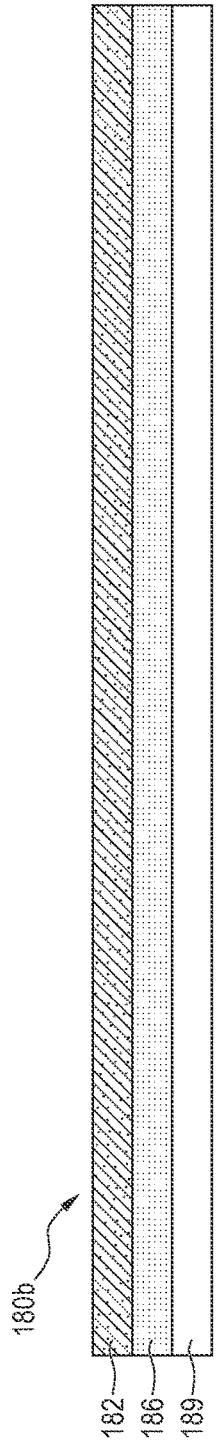

FIGS. 2b and 2c show exemplary ferromagnetic film 180 that can be disposed on encapsulant 170 to protect semiconductor die 104 from magnetic fields, or to absorb magnetic fields generated by the semiconductor die. Ferromagnetic film 180a in FIG. 2b has a pair of ferromagnetic layers 182 and 184 with adhesive layers 186 and 188. Ferromagnetic layers 182 and 184 are formed from materials with high magnetic permeability such as nickel-iron, nickel-iron-molybdenum, nickel-iron-molybdenum-copper, amorphous magnetic alloy, or nanocrystalline alloy. Any suitable nickel-iron based alloy, ferrite, soft ferromagnetic material, or alloys thereof can be used.

Adhesive layer 188 attaches ferromagnetic layer 182 and 184 together. Adhesive layer 186 is used to attach ferromagnetic film 180a to another surface. A protective release film 189 covers adhesive 188 during storage after manufacturing of the ferromagnetic film and until use of the ferromagnetic film. To mount ferromagnetic film 180a to a surface, protective release film 189 is first removed, and then the ferromagnetic film is stuck to the desired surface using adhesive 186.

Ferromagnetic film 180a is similar to a common structure for ferromagnetic film, where a black polymer layer is disposed over the first ferromagnetic layer 182 instead of the second ferromagnetic layer 184. A black polymer layer is commonly used for laser marking of the package. However, the black polymer layer is not needed because ferromagnetic film 180a is being embedded within semiconductor package 150. Therefore, the commonly used black polymer layer is replaced by second ferromagnetic layer 184 to improve magnetic shielding effectiveness.

FIG. 2c shows ferromagnetic film 180b with only a single ferromagnetic layer 182. Protective release film 189 is attached to ferromagnetic layer 182 by adhesive 186 as above. However, second adhesive layer 188 and second ferromagnetic layer 184 are not added.

Ferromagnetic film 180 is typically formed as a large sheet of material or a long tape that can be rolled up. To apply the ferromagnetic film 180, the ferromagnetic film can be cut into individual pieces and picked and placed onto semiconductor packages. Alternatively, a wafer-sized or wafer-shaped sheet of ferromagnetic film 180 can be attached onto a panel of devices and then singulated along with the panel.

Figure 2D:
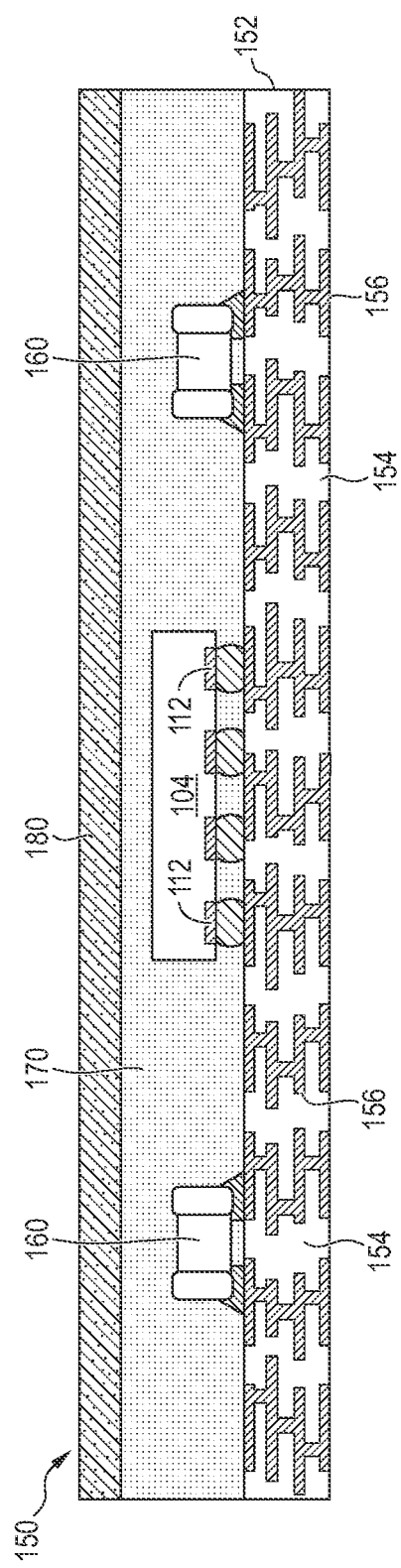

In FIG. 2d, ferromagnetic film 180 is disposed on the top surface of encapsulant 170. When substrate 152 remains as a panel or strip with multiple units formed at once, and encapsulant 170 is deposited over the entire strip or panel, e.g., to form a reconstituted wafer, then ferromagnetic film 180 can be disposed as a single piece over the entire panel or strip of multiple packages 150. Protective release film 189 is removed, and then ferromagnetic film 180 is attached to encapsulant 170 with adhesive 188.

Figure 2E:
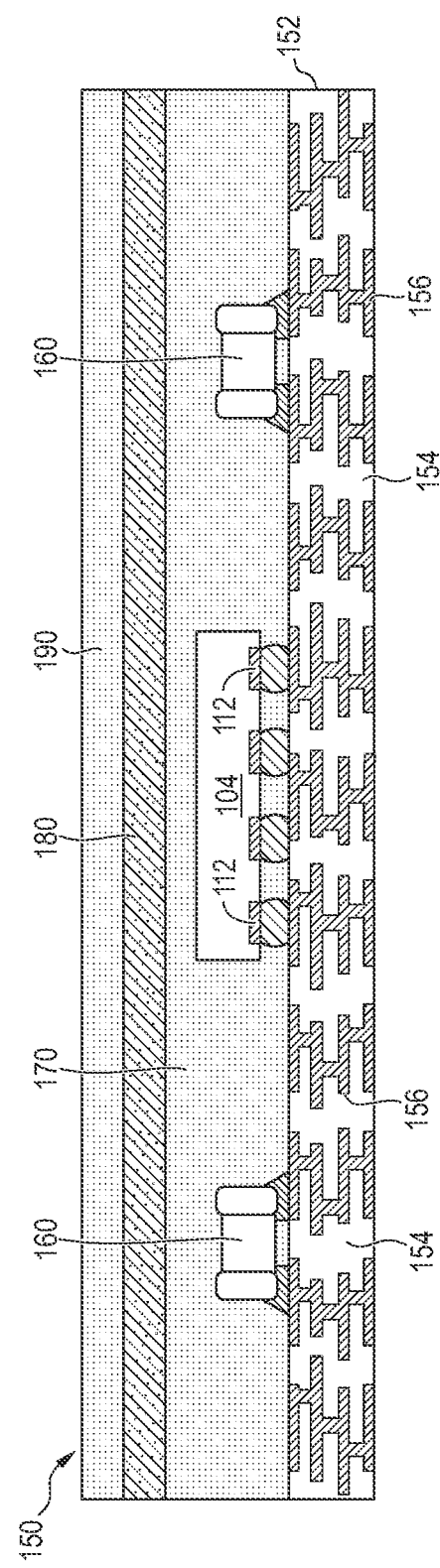

In FIG. 2e, a second encapsulant 190 is deposited over ferromagnetic film 180 in a second molding process. Any of the above-mentioned materials and methods can be used for encapsulant 190 as well as encapsulant 170. Encapsulant 190 can be formed from the same material as encapsulant 170 or a different material. Encapsulant 190 can be formed using the same type of molding process as encapsulant 170, or a different process can be used. In some embodiments, openings are formed through ferromagnetic film 180 so that the second encapsulant 190 extends through the openings to physically contact first encapsulant 170. Encapsulant 190 fully covers the top surface of ferromagnetic film 180.

Figure 2F:
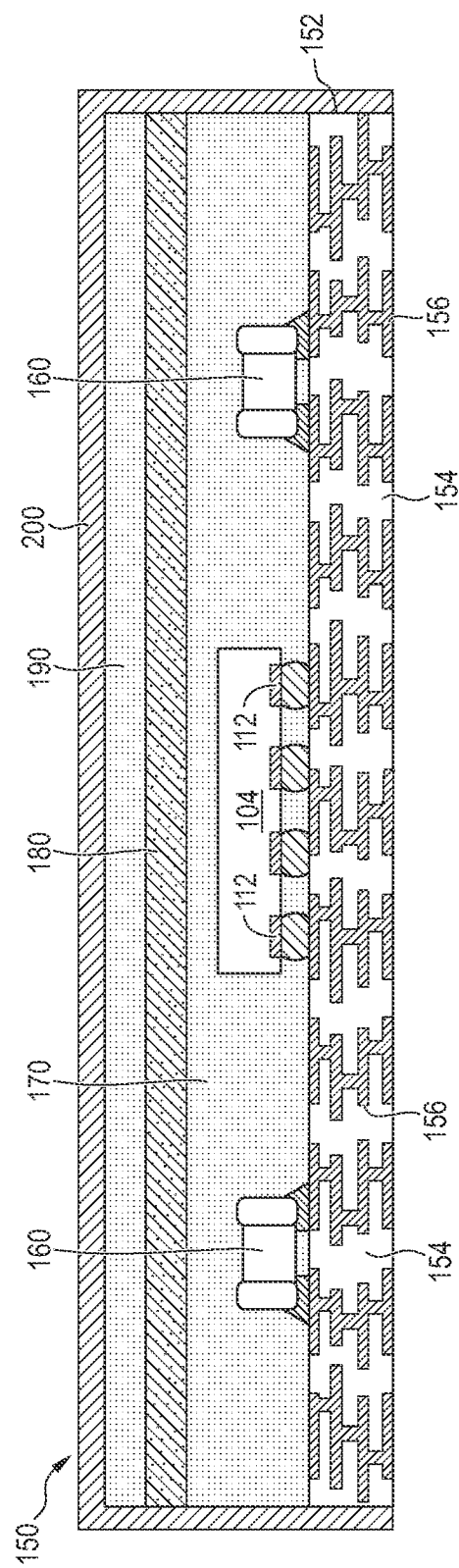

In FIG. 2f, a conductive material is sputtered over package 150 to form a conductive shielding layer 200. Shielding layer 200 is formed using any suitable metal deposition technique, e.g., chemical vapor deposition, physical vapor deposition, other sputtering methods, spraying, or plating. The sputtered material can be copper, steel, silver, aluminum, gold, combinations thereof, or any other suitable conductive material. In some embodiments, shielding layer 200 can be made by sputtering on multiple layers of differing material, e.g., stainless steel-copper-stainless steel or titanium-copper. Shielding layer 200 reduces electromagnetic interference (EMI) between the components of package 150 and other nearby electronic devices.

In embodiments where packages 150 are formed as a panel or strip on a larger substrate 152, the packages are optionally singulated from each other prior to forming shielding layer 200 so that the shielding layer extends down side surfaces of the singulated packages. Shielding layer 200 is grounded through conductive layers 156 to improve EMI reduction in embodiments where substrate 152 has a portion of the conductive layers exposed. The singulation also separates individual portions of ferromagnetic layer as part of the package singulation, which also exposes side surfaces of the ferromagnetic film. Shielding layer 200 therefore contacts side surfaces of ferromagnetic film 180, providing electrical grounding for the ferromagnetic film.

Semiconductor package 150 includes a ferromagnetic film 180 embedded within the package. Being embedded allows ferromagnetic film 180 to be located closer to semiconductor die 104 and thereby improve the performance of absorbing magnetic emissions from semiconductor die 104. Having ferromagnetic film 180 sandwiched between two layers of encapsulant 170 and 190 improves the delayering problem common with ferromagnetic film. Conformally forming shielding layer 200 in addition to sandwiching ferromagnetic film 180 between two layers of encapsulant further reduces delayering because the shielding layer adheres to encapsulant better than the ferromagnetic film, and also covers the side surface to physically hold the layers together at the point where delayering typically begins.

Figure 3A:
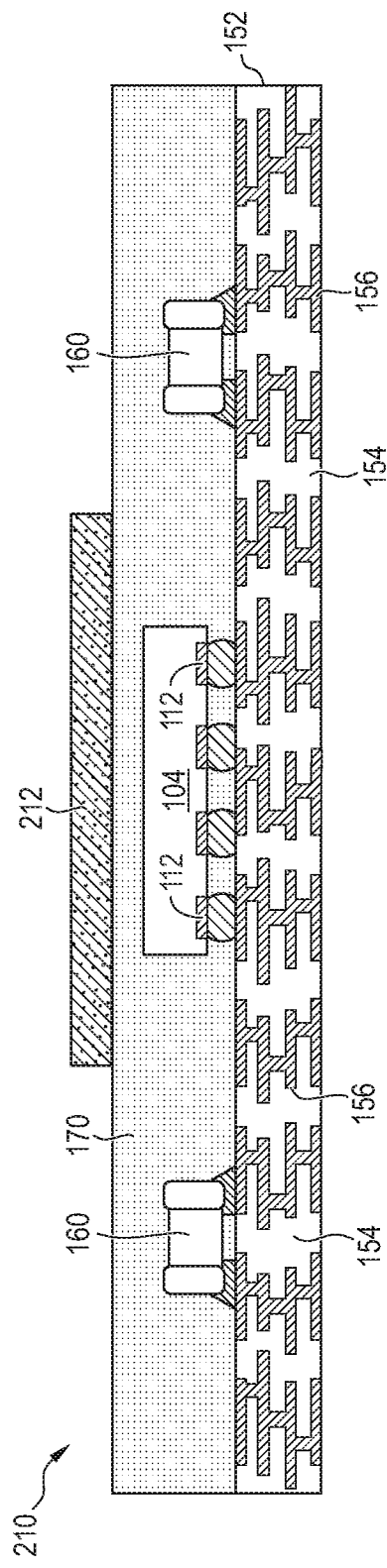
FIGS. 3a and 3b illustrate an alternative embodiment.
Figure 3B:
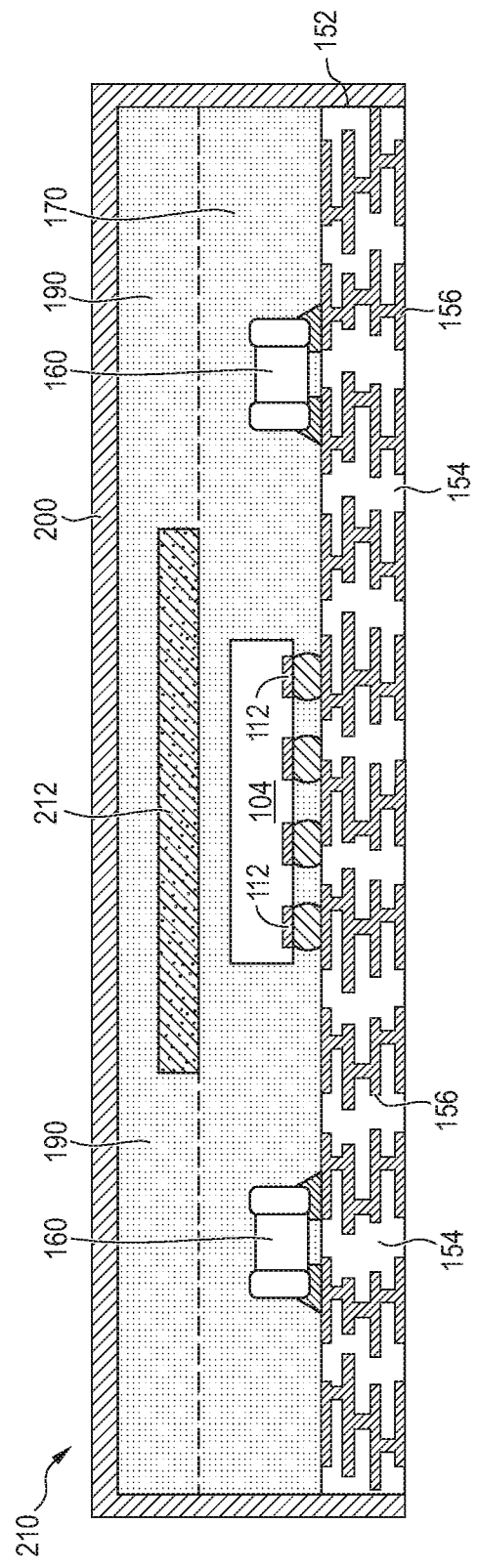

FIGS. 3a and 3b illustrate, continuing from FIG. 2a, another embodiment with semiconductor package 210 having a smaller piece of ferromagnetic film 212 disposed over semiconductor die 104 compared to ferromagnetic film 180 in package 150. Ferromagnetic film 212 has the same general structure as shown in FIGS. 2b and 2c for ferromagnetic film 180 and is simply cut into a smaller piece. Ferromagnetic film 212 is disposed over semiconductor die 104 to absorb magnetic emissions from the semiconductor die but can also be placed over other components needing magnetic shielding. Multiple pieces of ferromagnetic film can be used in each package if desired.

Encapsulant 190 is deposited to fully cover the top and side surfaces of ferromagnetic film 212. Encapsulant 190 extends down and physically contacts encapsulant 170 around ferromagnetic film 212 to fully envelope the ferromagnetic film. The border between encapsulants 170 and 190 is illustrated as a dotted line, but the physical border may or may not be discernable depending on the specific materials and methods used. Fully enveloping ferromagnetic film 212 in encapsulant greatly reduces delayering because the delayering issues that exist for ferromagnetic film do not apply to the surrounding seam where encapsulants 170 and 190 meet. Encapsulants 170 and 190 are not as likely to delayer from each other at the edges of package 210 compared to embodiments where the encapsulants are fully separated by ferromagnetic film 180.

FIGS. 4a-4d illustrate a semiconductor package 220 with the addition of conductive pillars 222. Conductive pillars 222 are formed of a magnetic metal with high magnetic permeability to absorb low frequency magnetic fields. Conductive pillars 222 provide lateral blocking of electromagnetic interference (EMI) between semiconductor die 104 and discrete components 160 and will provide electrical coupling of an overlying ferromagnetic film to electrical ground. Conductive pillars 222 can be a plurality of discrete pillars distributed around semiconductor die 104, or a single piece of material extending continuously all the way around the semiconductor die. Conductive pillars 222 may take the form of a bar, a support, or a can.

Conductive pillars 222 are formed from aluminum, copper, steel, titanium, gold, other metals, or a combination or alloy thereof. A material with magnetic properties is selected in one embodiment to create a continuous path for magnetic flux with an overlying ferromagnetic film. A magnetic metal with high magnetic permeability can be used to help absorb magnetic energy. Conductive pillars 222 are formed separately and then picked and placed onto substrate 152. In other embodiments, conductive pillars 222 are formed directly on substrate 152 using a photoresist layer as a mask that is removed.

Encapsulant 170 is deposited over conductive pillars 222 along with semiconductor die 104 and discrete components 160. In FIG. 4b, encapsulant 170 is backgrinded using a mechanical grinder 224, chemical etching, chemical-mechanical planarization, or another suitable method to reduce a height of encapsulant 160 and expose top surfaces of conductive pillars 222. After grinding, conductive pillars 222 and encapsulant 170 have coplanar top surfaces.

Figure 4C:
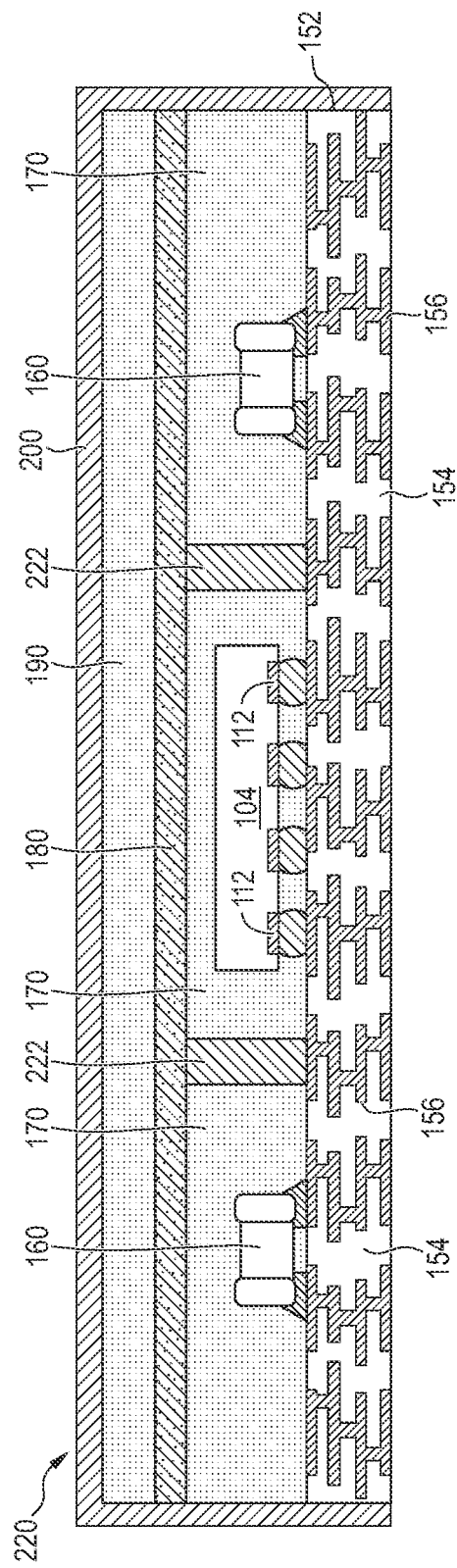
Figure 4D:
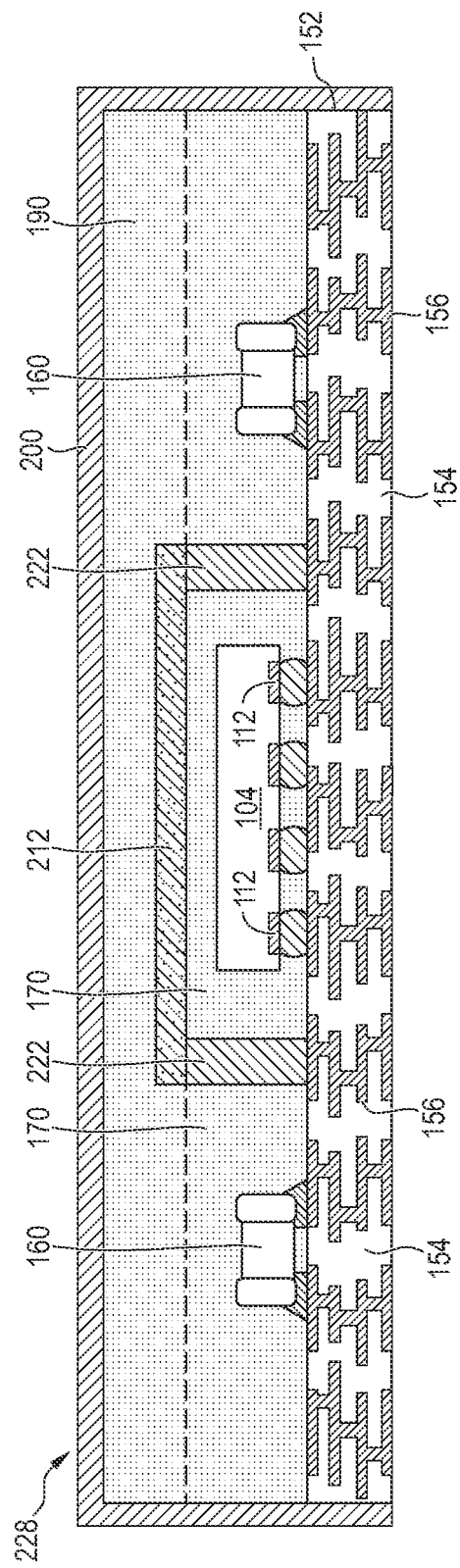

FIG. 4c illustrates a completed package 220 with conductive pillars 222 and ferromagnetic film 180. Ferromagnetic film 180 is disposed in physical contact with conductive pillars 222 to provide electrical and magnetic continuity. FIG. 4d illustrates a completed package 228 with ferromagnetic film 212. Ferromagnetic film 212 extends to physically contact conductive pillars 222 but still allows encapsulant 190 to physically contact encapsulant 170 around the ferromagnetic film. In one embodiment, conductive pillar 222 is a can extending completely around semiconductor die 104, and ferromagnetic film 212 has a footprint identical or similar to the can such that the combination of the can and ferromagnetic film forms a magnetic shield completely surrounding the semiconductor die on five sides.

Figure 5A:
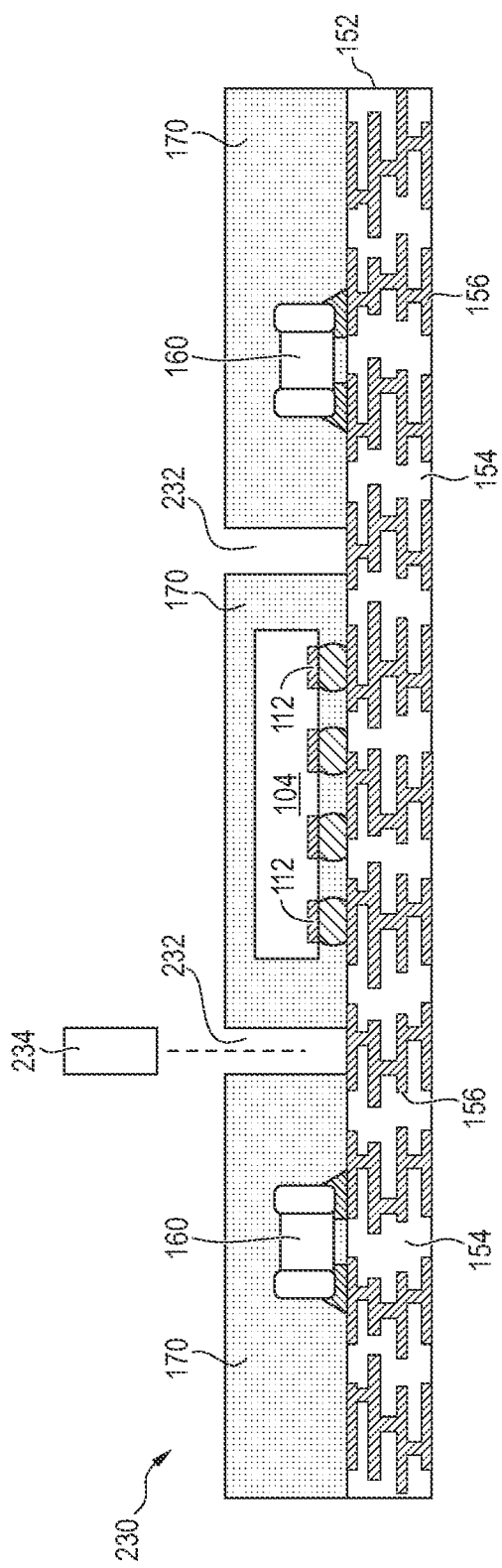
FIGS. 5a-5d illustrate another conductive pillar embodiment.

FIGS. 5a-5d illustrate an alternative conductive pillar embodiment where the conductive pillars are formed in openings of encapsulant 170. In FIG. 5a, trenches 232 are formed through encapsulant 170 using a laser cutting tool 234 to expose substrate 152. Trenches 232 are formed down to conductive layer 156 in embodiments where electrical grounding through substrate 152 is desired. Trenches 232 can be formed as a plurality of discrete through-holes or as a single trench extending continuously completely around semiconductor die 104.

Figure 5B:
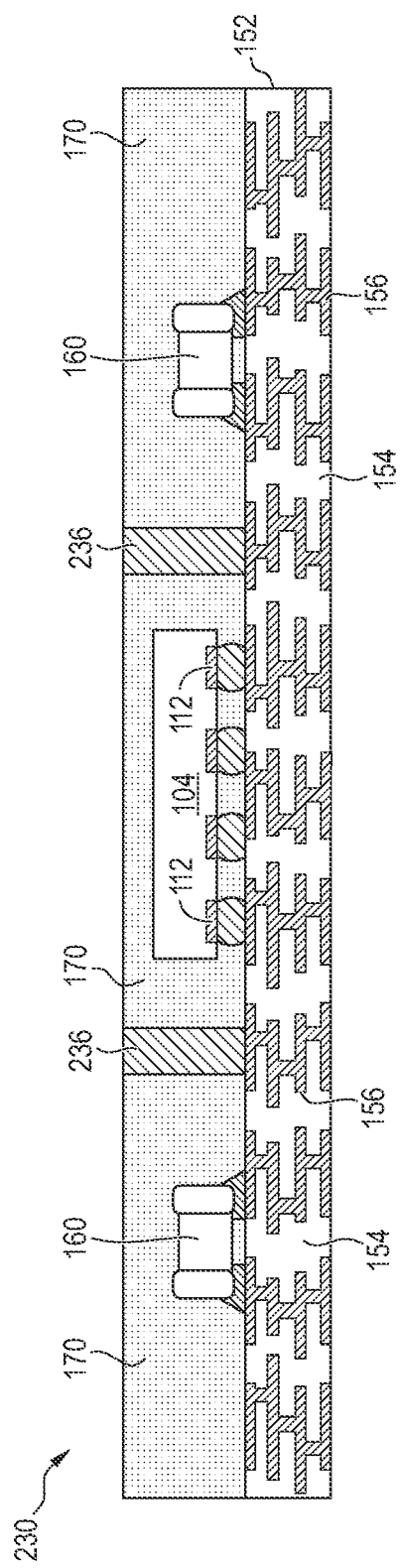

In FIG. 5b, trenches 232 are filled with a conductive or magnetic material to form conductive pillars 236. In one embodiment, jet printing is used to deposit a magnetic metal with high permeability into trenches 232 for conductive pillars 236. Conductive pillars 236 are formed to be coplanar to the top surface of encapsulant 170. In other embodiments, trenches 232 are over-filled with conductive material and then a backgrinding process is used to make conductive pillars 236 coplanar to encapsulant 170.

Figure 5C:
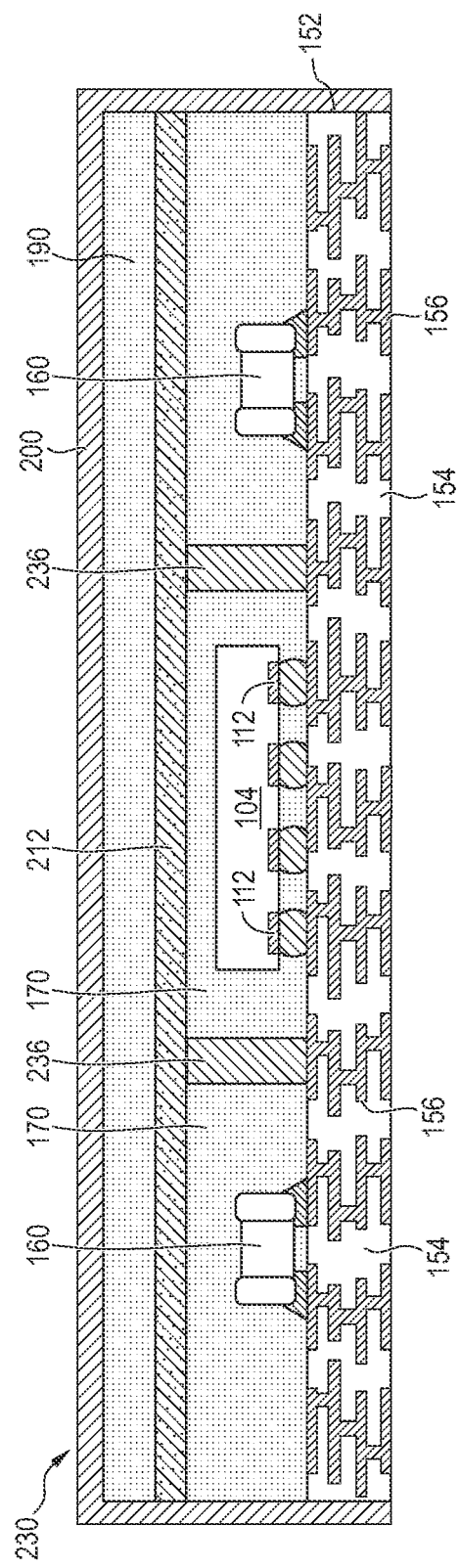
Figure 5D:
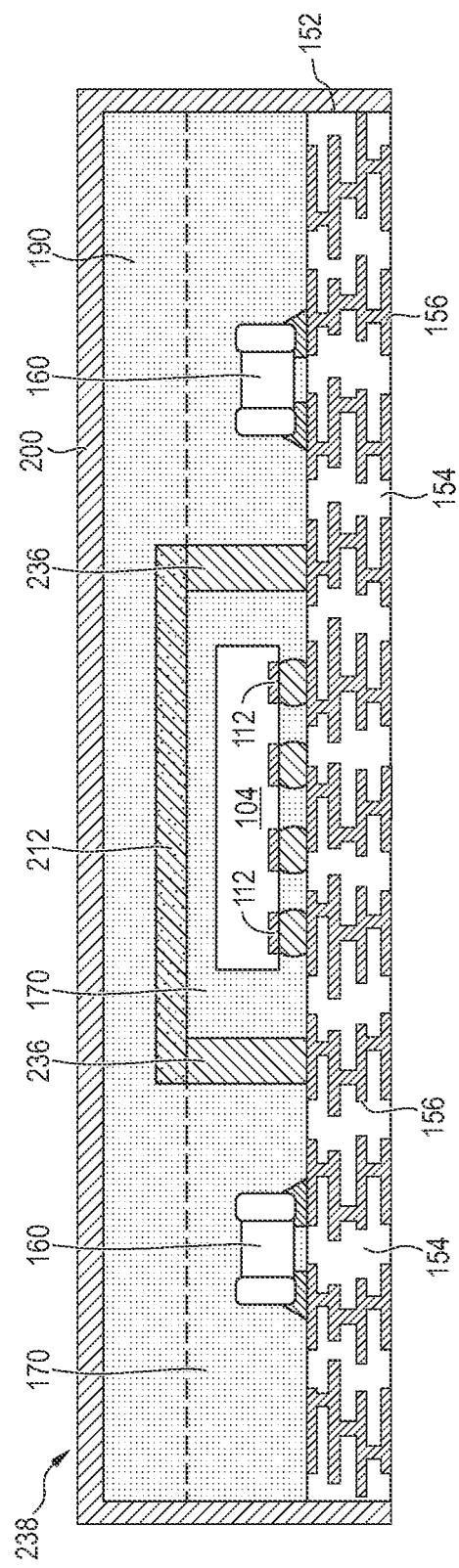

FIG. 5c illustrates a completed package 230 with conductive pillars 236 and ferromagnetic film 180. Ferromagnetic film 180 is disposed in physical contact with conductive pillars 236 to provide electrical and magnetic continuity. FIG. 5d illustrates a completed package 238 with ferromagnetic film 212. Ferromagnetic film 212 extends to physically contact conductive pillars 236 but still allows encapsulant 190 to physically contact encapsulant 170 around the ferromagnetic film.

Figure 6A:
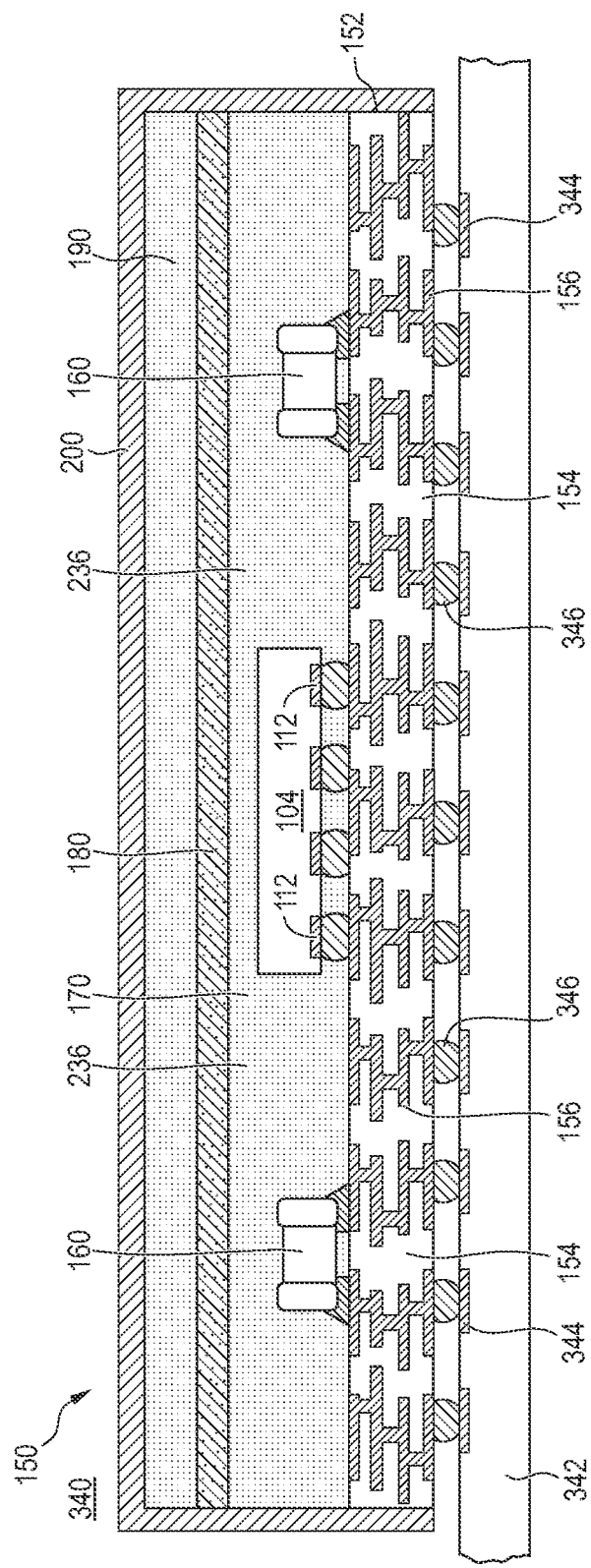
FIGS. 6a and 6b illustrate integrating the semiconductor packages into an electronic device.
Figure 6B:
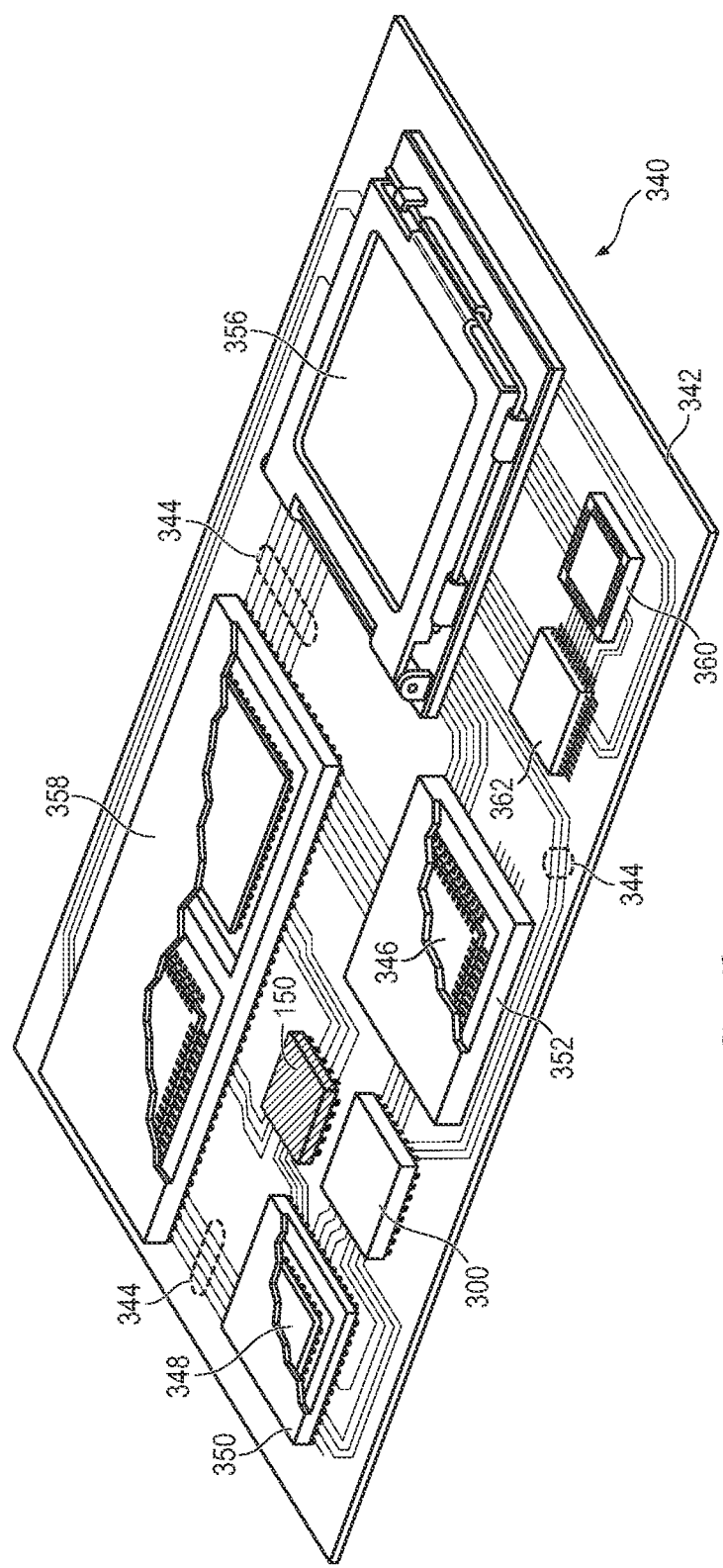

FIGS. 6a and 6b illustrate integrating the above-described semiconductor packages, e.g., semiconductor package 150, into a larger electronic device 340. FIG. 6a illustrates a partial cross-section of semiconductor package 150 mounted onto a printed circuit board (PCB) or other substrate 342 as part of electronic device 340. Bumps 346 are formed similar to the description of bumps 114 above at any desired stage of manufacture and are reflowed onto conductive layer 344 of PCB 342 to physically attach and electrically connect semiconductor package 150 to the PCB. In other embodiments, thermocompression or other suitable attachment and connection methods are used. In some embodiments, an adhesive or underfill layer is used between semiconductor package 150 and PCB 342. Semiconductor die 104 is electrically coupled to conductive layer 344 through substrate 152.

FIG. 6b illustrates electronic device 340 including PCB 342 with a plurality of semiconductor packages mounted on a surface of the PCB, including semiconductor package 150. Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 6b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 342 along with semiconductor package 150. Conductive traces 344 electrically couple the various packages and components disposed on PCB 342 to semiconductor package 150, giving use of the components within semiconductor package 150 to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising: providing a substrate; disposing a semiconductor die over the substrate; depositing a first encapsulant over the semiconductor die; disposing a ferromagnetic film over the first encapsulant; and depositing a second encapsulant over the ferromagnetic film, wherein vertical side surfaces of the first encapsulant, second encapsulant, and ferromagnetic film are coplanar.

2. The method of claim 1, further including forming a shielding layer over the substrate, first encapsulant, and second encapsulant.

3. The method of claim 1, further including:
forming a conductive pillar over the substrate;
depositing the first encapsulant over the conductive pillar; and
disposing the ferromagnetic film on the conductive pillar and first encapsulant.

4. The method of claim 3, further including forming the conductive pillar as a can extending continuously completely around the semiconductor die.

5. The method of claim 1, further including depositing the second encapsulant in contact with the first encapsulant around the ferromagnetic film.

6. The method of claim 1, further including singulating the first encapsulant, second encapsulant, and ferromagnetic film.

7. A method of making a semiconductor device, comprising: providing an electrical component; depositing a first encapsulant over the electrical component; disposing a ferromagnetic film over the first encapsulant; and depositing a second encapsulant over the ferromagnetic film, wherein vertical side surfaces of the first encapsulant, second encapsulant, and ferromagnetic film are coplanar.

8. The method of claim 7, further including forming a shielding layer over the first encapsulant, and second encapsulant.

9. The method of claim 7, further including:
forming a conductive pillar adjacent to the electrical component;
depositing the first encapsulant over the conductive pillar; and
disposing the ferromagnetic film on the conductive pillar and first encapsulant.

10. The method of claim 9, further including forming the conductive pillar as a can extending continuously completely around the electrical component.

11. The method of claim 7, further including depositing the second encapsulant in contact with the first encapsulant around the ferromagnetic film.

12. The method of claim 7, further including:
forming a trench in the first encapsulant; and
depositing an electrically or magnetically conductive material in the trench to form a conductive pillar or can.

13. The method of claim 7, further including singulating the first encapsulant, second encapsulant, and ferromagnetic film.

14. A method of making a semiconductor device, comprising:
providing a substrate;
disposing a semiconductor die over the substrate;
disposing an electrical component over the substrate;
depositing a first encapsulant over the semiconductor die;
disposing a ferromagnetic film over the first encapsulant with the electrical component outside a footprint of the ferromagnetic film; and
depositing a second encapsulant over the ferromagnetic film, wherein side surfaces of the first encapsulant, second encapsulant, and ferromagnetic film are coplanar.

15. The method of claim 14, further including forming a shielding layer over the substrate, first encapsulant, and second encapsulant.

16. The method of claim 14, further including disposing a conductive pillar in the first encapsulant between the substrate and ferromagnetic film and between the semiconductor die and electrical component.

17. The method of claim 16, wherein the conductive pillar comprises a can extending continuously completely around the semiconductor die.

18. The method of claim 14, wherein the second encapsulant physically contacts the first encapsulant continuously completely around the ferromagnetic film.

19. A method of making a semiconductor device, comprising:
providing a first electrical component;
providing a second electrical component;
depositing a first encapsulant over the first electrical component and second electrical component;
disposing a ferromagnetic film over the first encapsulant; and
depositing a second encapsulant over the ferromagnetic film, wherein side surfaces of the first encapsulant, second encapsulant, and ferromagnetic film are coplanar.

20. The method of claim 19, further including forming a shielding layer over the first encapsulant and second encapsulant.

21. The method of claim 19, further including disposing a conductive pillar or can in the first encapsulant under the ferromagnetic film and between the first electrical component and second electrical component.

22. The method of claim 19, wherein the second encapsulant physically contacts the first encapsulant around the ferromagnetic film.

23. The method of claim 19, wherein the ferromagnetic film includes a plurality of ferromagnetic layers.

* * * * *

UNITED STATES PATENT AND TRADEMARK OFFICE
CERTIFICATE OF CORRECTION

| | | |
|---|---|---|
| PATENT NO. | : 12,469,796 B2 | Page 1 of 1 |
| APPLICATION NO. | : 17/810028 | |
| DATED | : November 11, 2025 | |
| INVENTOR(S) | : ChangOh Kim et al. | |

It is certified that error appears in the above-identified patent and that said Letters Patent is hereby corrected as shown below:

In the Claims

Column 10, Claim 14, Line 18, add the word -- vertical -- after the word "wherein".

Column 10, Claim 19, Line 43, add the word -- vertical -- after the word "wherein".

Signed and Sealed this
Twenty-third Day of December, 2025

John A. Squires
*Director of the United States Patent and Trademark Office*